United States Patent [19]

Wilhelm

[11] 4,037,313
[45] July 26, 1977

[54] METHOD FOR THE MANUFACTURE OF A SUPERCONDUCTOR

[75] Inventor: Manfred Wilhelm, Nuremberg, Germany

[73] Assignee: Siemens Aktiengesellschaft, Munich, Germany

[21] Appl. No.: 665,820

[22] Filed: Mar. 11, 1976

Related U.S. Application Data

[63] Continuation of Ser. No. 488,834, July 15, 1974, abandoned.

[30] Foreign Application Priority Data

Aug. 1, 1973  Germany .............................. 2339053

[51] Int. Cl.$^2$ ............................................ H01V 11/00
[52] U.S. Cl. .................................................... 29/599
[58] Field of Search ...................... 29/599; 148/11.5 R, 148/20.3, 127; 174/DIG. 6, 126 CP, 128; 427/62

[56] References Cited

U.S. PATENT DOCUMENTS

| | | | |
|---|---|---|---|
| 3,332,800 | 7/1967 | Saur | 427/62 |
| 3,623,221 | 11/1971 | Morton et al. | 29/599 |
| 3,675,042 | 7/1972 | Merriam | 174/126 |
| 3,731,374 | 5/1973 | Suenaga et al. | 29/599 |
| 3,778,894 | 12/1973 | Kono et al. | 29/599 |
| 3,829,963 | 8/1974 | McDougall et al. | 29/599 |
| 3,930,903 | 1/1976 | Randall et al. | 29/599 X |

*Primary Examiner*—E. M. Combs
*Attorney, Agent, or Firm*—Kenyon & Kenyon, Reilly, Carr & Chapin

[57] ABSTRACT

The invention concerns a method for the manufacture of a superconductor which comprises a superconductive, intermetallic compound including at least two elements. A ductile component of at least one element of the compound is brought into contact with a ductile carrier metal bearing the other elements of the compound. The structure so obtained is heat-treated in a vapor formed over a separate melt of the elements found in the carrier metal in such a manner that the intermetallic compound is formed through reaction of the vapor, diffusing through the carrier metal, with the ductile component. The heat treatment applied until the ductile components and the other elements reach the same temperature is performed in a vacuum with a residual maximum gas pressure of $10^{-2}$ Torr or in an inert gas at a maximum gas pressure of 500 Torr.

18 Claims, 4 Drawing Figures

METHOD FOR THE MANUFACTURE OF A SUPERCONDUCTOR

This is a continuation of application Ser. No. 488,834 filed July 15, 1974, now abandoned.

BACKGROUND OF THE INVENTION

1. Field of the Invention

The invention concerns generally a method for the manufacture of a superconductor and more particularly, the manufacture of one having a superconductive intermetallic compound.

2. Description of the Prior Art

Superconductive intermetallic compounds consisting of two elements, of the type $A_3B$, e.g., $Nb_3Sn$ or $V_3Ga$, which have an A-15 crystal structure, exhibit very good superconduction properties and are distinguished particularly by a high critical magnetic field, a high transition temperature and a high critical current density. They are therefore highly suitable for use as superconductor coils for generating strong magnetic fields such as those needed for research purposes. Other applications are in superconducting magnets for the suspension guidance of magnetic suspension railroads or in windings of electric machines.

Several methods for manufacturing these superconductors in the form of long wires or ribbons are known. They are particularly employed in the manufacture of so-called multi-core conductors having wires, particularly of $Nb_3Sn$ and $V_3Ga$, arranged in a normal-conducting matrix. Generally in these methods a ductile element of the compound to be manufactured in wire form, e.g., a niobium or a vanadium wire, is surrounded by a jacket of an alloy comprising a ductile carrier metal and the other elements of the compound, for instance, a copper-tin alloy or a copper-gallium alloy. In particular, a multiplicity of such wires are embedded in a matrix of the alloy. The structure so obtained is then subjected to a cross section-reducing process. This results in a long wire such as is required for coils wherein the diameter of the niobium or vanadium wire is reduced to a value on the order ot about 30 to 50 $\mu$m or even less. The latter is desirable in view of the superconduction properties of the conductor. One further seeks to obtain through the cross section-reducing processing the best possible metallurgical bond between the wire and the surrounding matrix material of the alloy, without the occurrence of reactions that lead to an embrittlement of the conductor. After the cross section-reducing processing, the structure is subjected to a heat treatment such that the desired compound is formed through reaction of the wire material, with the other element contained in the surrounding matrix-in one example the tin or gallium. The element contained in the matrix diffuses into the wire material and reacts with the latter, forming a layer of the desired compound (German Offenlegungsschriften Nos. 2,044,660; 2,052,323 and 2,105,828).

These known methods are not satisfactory for a number of reasons. First, the diffusion process cannot be direcred in such a manner that all the gallium or tin present in the matrix for forming the intermetallic compound is consumed. It is therefore not possible to build up $V_3Ga$ or $Nb_3Sn$ layers of any desired thickness. The diffusion of gallium or tin in the direction toward the vanadium or niobium cores comes to a standstill when the activity of the elements gallium and tin in the copper matrix is equal to their activity in the produced intermetallic compounds $V_3Ga$ or $Nb_3Sn$. In other words no further $V_3Ga$ or $Nb_3Sn$ is formed if the concentration of the gallium or tin in the copper matrix has dropped to a certain value due to the diffusion of gallium or tin into the cores. For instance, if one diffuses gallium into vanadium cores from a copper-gallium matrix with 18 atompercent of gallium at a temperature of 700° C, the equilibrium condition mentioned is reached when the gallium content of the matrix has dropped to about 12 atom-percent. This means that only about 38% of the gallium available in the matrix has been converted to $V_3Ga$.

The thickness of the $Nb_3Sn$ or $V_3Ga$ layers formed in a multi-core conductor is therefore dependent not only on the annealing time, the annealing temperature and the composition of the copper-galium or copper-tin alloy, but also by the total amount of tin or gallium available for each core, i.e., on the volume of the part of the matrix available for each individual core.

In order to achieve a high effective critical current density, i.e., a high critical current density referred to the entire conductor cross section, however, layers thick as possible of the intermetallic compound to be prepared are required. Employing the prior art method this can only be achieved by making the ratio of the matrix component to the core component of the total cross section area of the conductor such that the growth of the layer is not limited by the available gallium or tin content in the alloy. In other words, a core spacing as large as possible is necessary. In multi-core conductors of given cross section, however, this requirement can only be met either by drawing the cores, if the number of cores is fixed, particularly thin in the cross section-reducing processing, or by reducing the number of the cores, if the core cross section is fixed. Either solution is not very satisfactory. On the one hand the drawing of the cores to form very thin filaments presents considerable difficulties and is quite expensive. On the other hand, if the number of cores is reduced, the effective current density is decreased and may only be offset generally by the thicker diffusion layers that may possibly be obtained. Finally, an arbitrary increase of the core spacings is not possible for technical reasons inherent in the deformation process. This is due to the fact that if one wishes to draw a larger number of vanadium or niobium cores uniformly thin in such a manner that their cross sections remain equal, the core spacing must not be too great.

A further difficulty with the known methods is that the matrix material containing the embedded cores and consisting of the carrier metal and the other elements of the compound to be manufactured is relatively hard to deform, particularly with higher concentrations of these elements. These matrix materials have the property that they harden very quickly in a cross section-reducing, cold-working process and become very difficult to deform further. With these methods it is therefore necessary to subject the conductor structure consisting of the cores and the matrix material, after relatively small deformation steps to an intermediate anneal for recuperating and recrystallizing the matrix structure. Although these heat treatments can be performed at temperatures and with annealing times at which the superconductive compound to be manufactured will not form, they are very time-consuming because of the required frequency. This increasing degradation of the deformability of the matrix materials with increasing content of the remaining elements of the compound to be manufactured limits their concentration and thus the thickness of the intermetallic compound layer. Further, with increasing concentration of these elements the melting point of the matrix material decreases. At very high concentrations this leads to problems in the heat process necessary for forming the intermetallic compounds. Furthermore, these elements can form undesired intermetallic phases with the carrier metal, if their concentration if too high.

There are known methods for avoiding the aforementioned, repeated intermediate anneals. In these methods, one or several cores of the ductile element are embedded in a ductile matrix material, e.g., copper, silver or nickel, which itself contains no element of the compound to be produced, or only very small amounts of such an element. The structure consisting of the cores and this matrix material is then processed without any intermediate anneal into a thin wire by a cross section-reducing process, as for example the cold-working process. After the last cross section-reducing step, the remaining elements of the compound to be produced, i.e., tin in the case of $Nb_3Sn$, are then applied to the matrix material. This is accomplished by immersing the wire briefly into a tin melt, so that a thin tin layer is formed on the matrix material, or by evaporating a tin layer onto the matrix parallel. Subsequently a heat treatment is then performed, in which the elements applied to the matrix material, are first diffused into and through the matrix material and then form the desired superconductive compound through reaction with the cores ("Applied Physics Letters" 20 (1972), pages 443 to 445; German Offenlegungsschrift No. 2,205,308).

However, in this method only relatively small amounts of the element can be applied to the matrix. If larger amounts of tin are applied, undesirable brittle intermediate phases of copper and the element can readily form at the temperature required for the diffusion of the element into the copper matrix. Further, if too much of the element is applied, the element itself or a surface area of the matrix can melt at the temperatures necessary for the diffusion of the element and can then easily drip off or run off from the matrix surface. The result is that only a limited amount of the lower-melting element is therefore available for the formation of the desired intermetallic compound.

German Offenlegungsschrift No. 2,205,308 teaches an expensive, multi-step process for converting all the niobium contained within a copper matrix into $Nb_3Sn$. The process calls for repeating the individual process steps of coating the matrix with tin and reacting the tin contained in the matrix with the niobium cores.

The continuous method for the manufacture of multi-core conductors of $Nb_3Sn$ described in the German Offenlegungsschrift No. 2,205,308 is a method wherein the conductor structure in wire form, consisting of a copper matrix and embedded niobium cores, is continuously conducted through an oven, in which several vessels with melted tin are arranged side by side. The conductor structure runs successively through the part of the oven interior situated above these vessels and then exits from the oven. The tin melt, through whose corresponding vapor space the conductor structure first runs is at a temperature of 1500° C. The other tin melts, are at a temperature of 1000° C. The conductor itself is held by the oven at a temperature of 850° C. Apparently, the tin vapor pressure in the vapor space over the first tin melt is so high that the transfer or deposition rate of the tin exceeds the solid diffusion rate of the tin into the copper matrix. Thus, a tin concentration gradient builds up quickly across the wire radius. The conductor structure is held above the tin melt of the higher temperature until sufficient tin, determined by the desired mean matrix composition, is applied. When the conductor structure next passes over the lower temperature melts, the tin vapor pressure is just high enough that the tin supply rate is reduced to a value which is equal to that at which the tin diffuses through the copper matrix and arrives at the surfaces or the niobium cores. The solid diffusion itself takes place at the temperature of 850° C. This temperature is chosen in order to prevent the tin from vaporating from the matrix and to prevent the matrix from melting. This method, however, is also extremely expensive because of the three temperatures required for the tin melts and the conductor structure and because the conductor structure itself must be held accurately positioned during the relatively laborious process.

The following therefore are some of the objects of this invention:

To provide a process for manufacturing a superconductor wherein the layer thickness of the superconductive, intermetallic compound is not limited by the process;

to employ a ductile matrix material that can be deformed cold without intermediate anneals;

to form the finished product employing but one heat treatment temperature and thereby simplify the procedure substantially;

To provide a process for producing a superconductor having a superconductive intermetallic compound layer comprising at least two elements which conductor can have various forms;

to provide a process whereby the thickness of the layers of superconductive intermetallic compounds can be controlled by varying the individual process parameters; and to provide an apparatus for implementing the process of the invention which does not inhibit access of the metal vapor to the conductor surface.

SUMMARY OF THE INVENTION

Towards the accomplishment of these objects and others which will become apparent from a reading of the specification, applicant provides a method for manufacturing a superconductor comprising a superconductive, intermetallic compound including at least two elements. A ductile component of at least one element of the compound is brought into contact with a ductile carrier metal bearing the other elements of the compound. The structure so obtained is heat-treated in a vapor formed over a separate melt of the elements found in the carrier metal in such a manner that the intermetallic compound is formed through reaction of the vapor, diffusing through the carrier metal, with the ductile component. The heat treatment applied until the ductile components and the other elements reach the same temperature is performed in a vacuum with a residual maximum gas pressure of $10^{-2}$ Torr or in an inert gas at a maximum gas pressure of 500 Torr.

Towards the accomplishment of the above process, since the heat treatment takes a relatively long time, and the constancy of the pressure is important, a closed chamber is provided. The chamber is adapted so that it can be evacuated and, if desired, filled with an inert gas. A spoke wheel arrangement is positioned in the chamber to take up the conductor which is to be exposed to the heat treatment. Further, a vessel is arranged in the chamber to receive the elements which form a part of the intermetallic compound and which are to be melted. A heating device surrounds the chamber and provides the heat ncessary to perform the process.

BRIEF DESCRIPTION OF THE DRAWINGS

Reference is now made to the accompanying drawings for a better understanding of the nature and objects of the invention. In the drawings.

DESCRIPTION OF THE PREFERRED EMBODIMENTS

Figure 1:
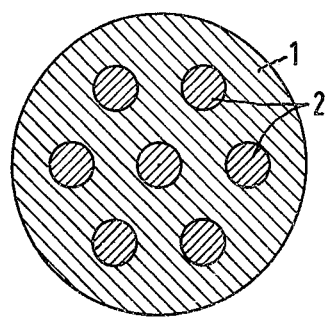
FIG. 1 shows schematically, in cross section, a conductor structure for a multi-core conductor prior to the heat treatment, to be manufactured by the method according to the invention.

The method according to the invention is particularly well suited for the manufacture of a superconductor which comprises a superconductive intermetallic compound, consisting of two elements, of the type AB with an A-15 crystal structure. In the preparation of such compounds the first component consists of the higher-melting element of the compound, while the heat treatment is performed in the vapor of the lower-melting element.

Particularly good cold-formability of a conductor structure consisting of the first and the second component is achieved if the second component consists only of the carrier metal. However, in this case the heat treatment required for forming thicker layers of the intermetallic compound takes a relatively long time. The time of the heat reatment required for producing a given layer thickness can be shortened if the second component contains, in addittion ot the carrier metal, a share of the remaining elements of the compound to be produced.

Copper and silver or a ductile alloy of these metals are particularly well suited as the carrier metal for the second component. In some cases, other ductile metals are also suitable. These must allow a sufficient diffusion of the other elements towards the first component of the compound and must have no interfering reaction with the elements of the compound to be produced.

The thickness of th layers of superconductive intermetallic compounds produced by the method according to the invention can be controlled by varying the individual process parameters. For a given vacuum or inert gas pressure and a given composition of the second component containing either the carrier metal or if applicable, the carrier metal and the other elements of the compound, the layer thickness increases with increasing diffusion time or increasing temperature of the heat treatment. If the temperature and the diffusion time are given, the layer thickness can be controlled by a corresponding choice of the vacuum or the inert gas and the inert gas pressure. Inert gases are understood here to be gases which do not react in the heat treatment with the metals participating in the reaction. Particularly well suited inert gases for this method are the rare gases and preferably helium or argon. The largest layer thicknesses of the intermetallic compound are obtained if the heat treatment is performed in a vacuum. If particularly large layer thicknesses are desired a vacuum with a residual gas pressure of about $10^{-5}$ Torr or less and application of the heat treatment for at least 45 hours has been found advantageous.

If the heat treatment is performed in a rare gas, the compound layers formed become thicker with decreasing pressure in the reaction space. With the pressure in the reaction space constant, the layers formed become thicker if a gas having a smaller atomic weight is used. Thus, if $V_3Ga$ or $Nb_3Sn$ layers with a thickness of 5 $\mu m$ or more are desired, the gas pressure should be at most 500 Torr for a heat treatment in helium. The heat treatment would have to last at least 100 hours. For a comparable heat treatment in argon, one need only work with a gas pressure of at most 100 Torr to achieve the same layer thickness.

If the second component contains, in addition to the carrier metal, elements of the compound to be produced, i.e., consists, for instance, of a copper-gallium alloy or a copper-tin alloy instead of pure copper, thicker compound layers are obtained, for otherwise equal conditions. However, the gallium or tin content of the second component should not be too high for the aforementioned reasons. Further, if the gallium or tin content of the carrier metal is too high, there's a likelihood it will be difficult to bend the finished conductors.

With regard to the heat treatment required, it has been found that a temperature no higher than that required for the treatment of the conductor itself is necessary. It has been found that the temperature required or the treatment of the conductor structure is below the melting temperature of the alloy formed, during the treatment, from the carrier metal and the other elements of the compound. However, it is high enough to cause a quantity of vapor of the other elements to form above the melt which, in an appropriate vacuum or inert gas, is sufficient for forming the desired layer thickness of the intermetallic compound once it diffuses into the carrier metal.

A preferable adaptation of the method according to the invention is its application to the manufacture of multi-core conductors. In this adaptation, several cores of the first component are first embedded in a matrix material of the second component which, together, is then processed for cross section reduction. After the last cross section-reducing process step, the heat treatment is then performed in the vapor of the other elements of the compound to be produced.

The cores of the multi-core conductors to be fabricated by the method according to the invention, incidentally, need not be solid cores of, for instance, vanadium or niobium. The core alternately may contain a center metal which has a high, thermal and electric conductivity and which has normal electrical conductive properties at the operating temperature of the superconductor, and a surrounding jacket which comprises at least one element of the compound. The center metal used, further, must not react during the heat treatment process to form interfering layers. Lastly, problems with the process are simplified if the center material can be the same material as the matrix material forming the carrier metal for the other elements. Particularly well suited for the core center material is copper and silver.

Since the heat treatment takes relatively long time, it is preferable that the invention be performed in a closed chamber. Further, in a closed chamber it is easier to keep the pressure conditions which, as mentioned, influence the course of the reaction considerably, constant over an extended period of time.

Figure 4:
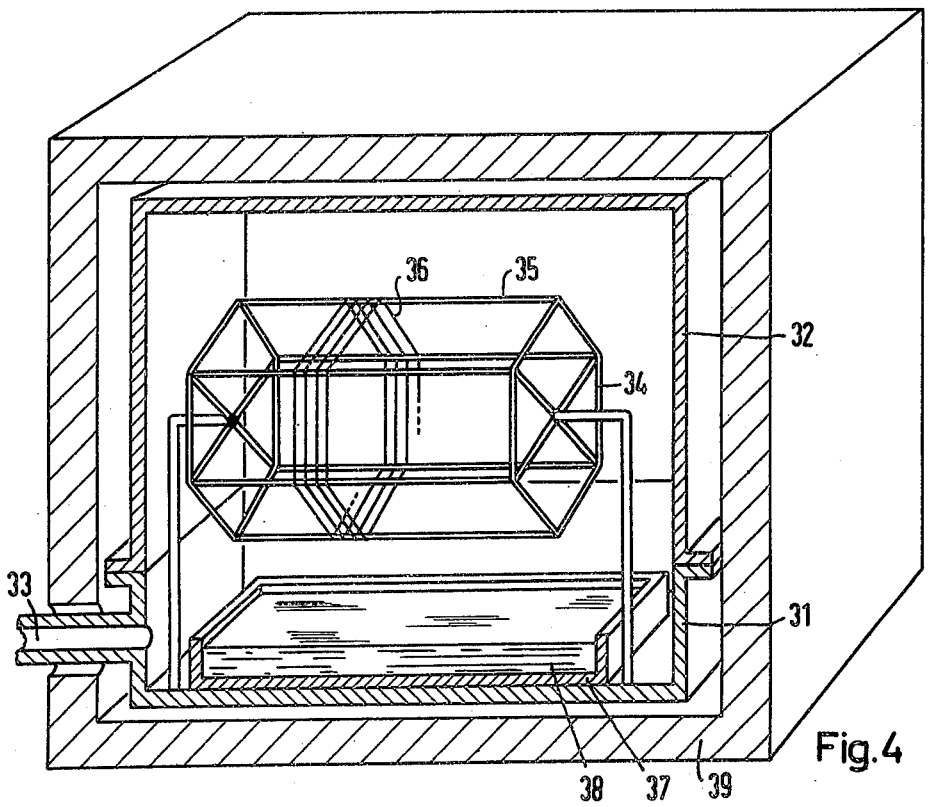
FIG. 4 shows schematically, in cross section, a preferred embodiment of an apparatus for carrying out the method according to the invention.

A suitable apparatus, especially where very long conductors are too be made according to the invention, is shown diagramatically in FIG. 4. It consists essentially of a chamber which is composed of a lower part 31 and a removable upper part 32. The chamber can be evacuated and, if required, filled with an inert gas via the pipe connection 33. A spoke wheel 34 is arranged and is adapted to take up the conductor structure which is to be submitted to the process. This arrangement is advantageous in that only a small section of the conductor contacts the rungs thereby providing virtually uninhibited accesss of the metal vapor to the conductor surface. Towards this end adjacent turns on the wheel are wound so that they don't touch each other. The rungs 35 of the wheel should be made from a temperature-resistant material which is inert with regard to the materials of the conductor. Ceramic rungs have been found suitable.

In the chamber there is further a vessel 37 to receive the gallium or tin supply 38 which is to melted. On the outside, the chamber is surrounded by an oven 39, for instance, an electric resistance furnace by means of which it can be heated to the temperature required for the heat treatment.

Particular examples illustrative of how the method according to the invention can be used to fabricate superconductors will now be shown. Generally the examples described concern formation of the intermetallic compound $V_3Ga$ or $Nb_3Sn$. It is to be realized of course that the method has application to the formation of any superconductive intermetallic compound of the type $A_3B$, comprising two elements and having an A-15 crystal structure.

For the manufacture of a superconductor having an intermetallic compound, $V_3Ga$, the first component consists, of course, of vanadium and the second component comprising a carrier metal of copper, silver or a copper-silver alloy, and containing 0 to 23 atom-percent of gallium. If good cold-formability is desired, it should contain no more than 15 atom-percent of gallium. Particularly good cold-formability up to a cross section reduction of about 99% is obtained if the gallium content of the second component is at most 12 atom-percent. The heat treatment for producing a superconductor with $V_3Ga$ is best performed at a temperature between 600° to 950° C. The temperature treatment and the gallium content of the second component must be matched so that the second component does not melt during the heat treatment due to diffusion of additional gallium from the vapor phase. Temperatures between 600° and 750° C have been found particularly advantageous for the heat treatment. Some examples of the formation of a $V_3Ga$ layer will now be illustrated.

EXAMPLE 1

For fabricating a $V_3Ga$ single-core conductor, a vanadium rod with a diameter of about 7 mm was placed in a copper tube with an outside diameter of about 20 mm. In a number of cross section-reducing cold-drawing passes this structure was processed into a wire with an outside diameter of 0.4 mm and a diameter of the vanadium core of 0.15 mm. A piece of the wire made in this manner was placed together with a supply of gallium in a quartz ampoule. After purging with helium, this quartz ampoule was evacuated to a residual gas pressure of $10^{-5}$ Torr and then sealed off. The gallium supply was arranged so that the piece of wire could not come into contact with the liquid gallium. The sealed ampoule was then heated for 48 hours to a temperature of 700° C. After this heat treatment, in which the wire as well as the gallium melt were at the same temperature of 700° C, the ampoule was opened and the wire examined. The examination showed that a $V_3Ga$ layer 8 μm thick had formed at the surface of the vanadium core. The vaporous gallium therefore diffused into the copper jacket of the wire and through the latter and reacted with the vanadium core, forming a relatively thick $V_3Ga$ layer. The gallium vapor pressure over the melt is about $10^{-7}$ to $10^{-6}$ Torr at the temperature of 700° C.

EXAMPLE 2

Another piece of the wire made in accordance with Example 1 with a vanadium core and a copper jacket was heat-treated together with a supply of gallium in a vacuum of about $10^{-5}$ Torr for 46 hours at a temperature of 660° C. The $V_3Ga$ layer formed at the surface of the vanadium core had a thickness of about 2 μm.

EXAMPLE 3

For fabricating another $V_3Ga$ single-core conductor, a vanadium rod with a diameter of about 10 mm was placed in a tube of a copper-gallium alloy with 10 atom-percent of gallium and the remainder copper. The latter had an outside diameter of about 20 mm. In a number of cold-working passes, this structure was then processed into a wire with an outside diameter of 0.4 mm and a diameter of the vanadium core of 0.2 mm. Because of the relatively low gallium content of the copper-gallium tube, no intermediate annealing between the individual cross section-reducing cold-working passes was necessary. A piece of the wire fabricated in this manner was then kept, together with a supply of gallium, for 48 hours in a vacuum of about $10^{-5}$ Torr at a temperature of 700° C. In this heat treatment, a $V_3Ga$ layer with a thickness of 10 μm was formed at the surface of the vanadium core. As a control experiment, another piece of the wire consisting of the vanadium core and the copper-gallium tube was also heated at a temperature of 700° C for 48 hours in the same vacuum, but without the presence of the gallium supply. Examination of this wire showed that no $V_3Ga$ layer at all had formed at the surface of the vanadium core. This was so because the gallium concentration in the copper-gallium jacket was too low for the formation of such a layer.

EXAMPLE 4

A wire prepared in accordance with Example 3 was heated together with a supply of gallium for 47 hours in a vacuum of about $10^{-5}$ Torr at a temperature of 660° C. The $V_3Ga$ layer was 4 μm thick.

EXAMPLE 5

Another piece of the wire fabricated in accordance with Example 3 was heated for 63 hours together with a supply of gallium in a quartz ampoule filled with helium of a vapor pressure of about 500 Torr to 700° C. The $V_3Ga$ layer formed at the surface of the vanadium core was about 3 μm thick. With a heat treatment of 100 hours, a $V_3Ga$ layer thickness of more than 5 μm was obtained under otherwise equal conditions.

EXAMPLE 6

For manufacturing a $V_3Ga$ multi-core conductor a vanadium rod with a diameter of about 10 mm was first placed in a tube of a copper-gallium alloy with 18 atom-percent of gallium and the remainder copper, and an outside diameter of about 20 mm. This structure was then processed by cross section-reducing cold-working passes into a wire with an outside diameter of about 1 mm. Because of the relatively high gallium content of the gallium-copper alloy, an intermediate anneal was performed (30 minutes at about 550° C) after each deformation by 30%. 60 pieces of wire obtained in this manner were then placed in a copper tube and, with intermediate annealing after each 30% of deformation, were processed for cross section reduction so far until a conductor structure with an outside diameter of 0.4 mm was obtained. This conductor structure contained 60 vanadium cores with an average core diameter of 37 $\mu$m. The average core spacing was 7 $\mu$m. A piece of the conductor structure made in this manner was then heated for 112 hours in a vacuum of about $10^{-5}$ Torr, together with a supply of gallium, to a temperature of 700° C. Subsequent examination showed that in this heat treatment all the vanadium cores of the conductor structure were converted into $V_3Ga$ over their entire cross section.

EXAMPLE 7

A piece of the conductor structure made in accordance with Example 6 with 60 vanadium cores was heated for 112 hours in argon with a pressure of about 500 Torr, together with a gallium supply, at a temperature of 700° C. In this heat treatment, a $V_3Ga$ layer with a thickness of about 3 $\mu$m was formed at the surface of each individual vanadium core.

EXAMPLE 8

A piece of the conductor structure made in accordance with Example 7 was heated for 112 hours in argon with a pressure of about 100 Torr in the presence of a gallium supply at a temperature of 700° C. In this heat treatment, $V_3Ga$ layers with a thickness of about 5 $\mu$m were formed at the surface of each individual vanadium core.

EXAMPLE 9

Another piece of the conductor structure made in accordance with Example 6 was heated, together with a gallium supply, for 46 hours in a vacuum of about $10^{-5}$ Torr at a temperature of 660° C. In this heat treatment a $V_3Ga$ layer with a thickness of about 7 $\mu$m was formed at the surface of each individual vanadium core.

The effective critical current density of the resulting superconductor was checked at a temperature of 4.2 K in an external magnetic field having a magnetic flux density of 5 Tesla. It was found to be $1.2 \times 10^5$ A/cm$^2$.

In a control experiment under the same conditions, but without the gallium supply, $V_3Ga$ layer thickness was about 1.3 $\mu$m. This multi-core conductor with the reduced layer thickness was found to have an effective critical current density of only $3 \times 10^4$ A/cm$^2$ in an external magnetic field of 5 Tesla at 4.2 K.

Figure 2:
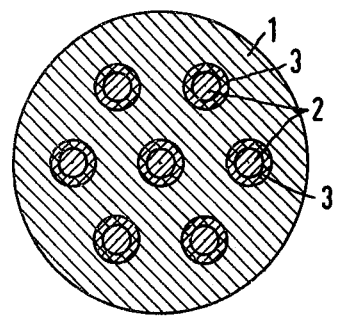
FIG. 2 shows the conductor structure of FIG. 1 after the final heat treatment according to the invention.

The manufacture of a conductor according to Example 9 is illustrated still further in FIGS. 1 and 2. For reasons of clarity fewer vanadium cores are shown in the figures than the specific example described above. FIG. 1 shows the conductor structure after the last cross section-reducing processing step, but prior to the heat treatment. A number of vanadium cores 2 are embedded in a copper-gallium matrix 1. The condition of the finished conductor after the heat treatment is shown in FIG. 2. During the heat treatment, the $V_3Ga$ layers 3 were formed at the surface of the individual vanadium cores 2.

EXAMPLE 10

Another piece of the conductor structure with 60 vanadium cores fabricated in accordance with Example 6 was heated together with a gallium supply for 46 hours in argon with a pressure of about 100 Torr, at a temperature of 660° C. A $V_3Ga$ layer about 2 $\mu$m thick was formed at the surface of each vanadium core.

EXAMPLE 11

In this example, the manufacture of a $V_3Ga$ multi-core conductor will be illustrated, in which the individual vanadium cores contain centers of copper. To fabricate such a conductor, a copper core in wire form with a vanadium jacekt and a copper-gallium sheath with 18 atom-percent of gallium and the remainder copper was made first. For this purpose a copper rod was first placed in a tubular vanadium jacket and the latter in turn in a tube of copper-gallium alloy and the structure obtained in this manner was processed for cross section reduction. Sixty of these wires were combined in a bundle and placed in a copper tube to facilitate the subsequent further cross section-reducing processing steps; the copper tube was removed again after the cross section-reducing processing of the conductor. The conductor structure obtained in this manner was processed by further cross section-reducing processing steps into a wire with an outside diameter of about 0.4 mm. After this treatment, the individual vanadium jackets had an outside diameter of about 35 $\mu$m and a wall thickness of about 7.5 $\mu$m. The outside diameter of the copper centers was about 20 $\mu$m. The thickness of the copper-gallium layer present between the individual vanadium jackets was about 13 $\mu$m. The wire fabricated in this manner was heated for 49 hours, together with a gallium supply, in a vacuum of about $10^{-5}$ Torr at a temperature of 660° C. $V_3Ga$ layers with a thickness of about 3 $\mu$m were formed at the surface of the vanadium jackets of the individual cores. Critical currents of 76 to 90 A were measured when the finished wire was placed in an external magnetic field of 5 Teslas at 4.2° K. For comparison a piece of the same wire was subjected to the same heat treatment under the same conditions, but without the supply of gallium. The $V_3Ga$ layers formed in this control experiment had a thickness of only about 1 $\mu$m or less. In a magnetic field of 5 Teslas, this wire had a critical current of only 20 A at 4.2° K.

Figure 3:
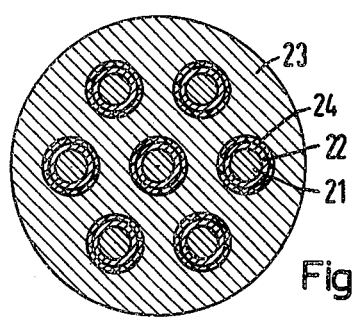
FIG. 3 shows schematically, in cross section, a further example of an embodiment of a multi-core conductor manufactured in accordance with the invention.

A multi-core conductor fabricated in accordance with Example 11 is shown diagrammatically in FIG. 3. A number of cores with a copper center 21 and a vanadium jacket 22 are embedded in a copper-gallium matrix 23. The $V_3Ga$ layers formed at the surface of the vanadium jackets 22 are designated with 24. In the manufacture of such a conductor one can also start, of course, with a pure copper matrix instead of with the copper-gallium matrix.

The method according to the invention is also well suited for the manufacture of superconductors with the intermetallic compound $Nb_3Sn$. For the manufacture of a superconductor with this compound, one starts out with a structure whose first component consists of niobium and the second component of copper, silver or a copper-silver alloy, having a tin content of 0 to 8.5 atom-percent. If good cold-formability is desired, the tin content should not exceed 4 atom-percent. The heat treatment, of course, is performed at a temperature at which the second component will not melt. This lies in a range between 600° and 850° C, and preferably between 600° C and 800° C.

EXAMPLE 12

For manufacturing an $Nb_3Sn$ multi-core conductor, a niobium rod was first placed in a copper tube and this structure was then drawn into a long wire without intermediate annealing. Twenty sections of this wire were then combined in a bundle, again placed in a copper tube and drawn by cross section-reducing cold-formation to a wire with an outside diameter of about 0.65 mm. The twenty niobium cores contained in the wire had a diameter of about 50 $\mu$m each. The average core spacing was 35 $\mu$m. A piece of the conductor structure made in this manner was then heated for 63 hours together with a supply of tin in a vacuum of about $10^{-5}$ Torr at a temperature of 700° C. In this heat treatment, $Nb_3Sn$ layers with a layer thickness of about 5 $\mu$m were formed at the surface of the niobium cores. The tin vapor pressure at 700° C is about $10^{-6}$ to $10^{-7}$ Torr.

EXAMPLE 13

Another piece of the conductor structure made in accordance with Example 12 was kept at a temperature of 750° C for 46 hours in a vacuum of about $10^{-5}$ Torr, together with a supply of tin. In this heat treatment $Nb_3Sn$ layers with a thickness of about 14 $\mu$m were formed at the surfaces of the niobium cores.

EXAMPLE 14

For manufacturing an $Nb_3Sn$ single-core conductor, a niobium rod was placed in a copper tube and processed together with the latter by cross section-reducing cold-formation into a wire with an outside diameter of 0.55 mm. The diameter of the niobium core in this wire was 0.15 mm. A piece of the wire made in this manner was then heated for 46 hours, together with a tin supply, in a vacuum to a temperature of 750° C. An $Nb_3Sn$ layer with a thickness of about 7 $\mu$m was formed at the surface of the niobium core.

As already mentioned, the method accoding to the invention is suited not only for the manufacture of superconductors components of wire form, but also for the manufacture of superconducting components of different form. A superconducting shielding baffle or a superconducting shielding cylinder with a $V_3Ga$ layer can, for instance, be manufactured by providing a vanadium plate or a vanadium cylinder with a copper layer on one side and heating the arrangement obtained in this manner for 50 hours to a temperature of about 700° C in a vacuum of $10^{-5}$ Torr in the presence of a supply of gallium. Gallium then diffuses into the copper layer and reacts with the adjoining vanadium, forming a $V_3Ga$ layer. On the copper-free side of the vanadium component, however, practically no reaction between vanadium and gallium takes place under the conditions indicated, so that no $V_3Ga$ layer is formed there.

The first component with a higher-melting element of the compound to be produced need not consist of a single metal in the method according to the invention, but may also contain additives. For instance, titanium, zirconium or tantalum in quantities of up to about 30% by weight may be admixed to the niobium or the vanadium. Additions of hafnium are also possible. A vanadium-niobium alloy can also be used. Instead of only one other element of the compound to be produced, such as gallium or tin being present in the carrier metal several such elements can also be contained therein, i.e. both tin and gallium could be present. This is also true of the metal vapor to be used in the heat treatment, so that both tin and gallium could be present side by side.

Other variations in the above embodiments, not illustrated, will be obvious to those skilled in the art without deviating from the scope of the invention as defined in the appended claims.

I claim:

1. An improved method for manufacturing a superconductor in the form of a superconductive intermetallic compound of the type $A_3B$ with an A-15 crystal structure including at least two elements the first of which is a ductile element having a higher melting point and the second an element having a lower melting point comprising the steps of:
   a. providing a single melt consisting of the second element;
   b. providing a starting structure consisting of the first element surrounded by and embedded in a ductile carrier metal;
   c. placing said melt and said starting structure together in a chamber with said starting structure disposed above said melt;
   d. providing an inert atmosphere in said chamber by one of evacuating said chamber to a maximum residual gas pressure of $10^{-2}$ torr and pressurizing said chamber with an inert gas to a maximum pressure of 500 torr; and
   e. heating both said single melt and starting structure to the same temperature, said temperature being between 600° and 950° C, and maintaining said temperature such that said melt forms a vapor of said second element, said vapor reacting with said starting structure such that said superconductive intermetallic compound is formed through the reaction of said vapor of said second element, diffusing through said ductile carrier metal, with said first element.

2. The method according to claim 1 wherein said starting structure comprises a matrix of said ductile carrier metal into which are embedded a plurality of wires of said first element and further including the step of reducing the cross section of said starting structure prior to placing said starting structure in said chamber.

3. The method according to claim 1 wherein said ductile carrier metal is selected from the group consisting of copper, silver and ductile alloys of copper or silver.

4. The method according to claim 3 wherein said carrier metal consists of one of the group of claim 1 and a predetermined percentage of said lower melting point element.

5. The method according to claim 1 wherein said superconductive intermetallic compound is $V_3Ga$.

6. The method according to claim 5 wherein said first element consists of vanadium and wherein said carrier metal consists of one of the group consisting of copper, silver and ductile alloys of copper or silver and a percentage of gallium up to 23 atom percent.

7. The method according to claim 6 wherein the percentage of gallium does not exceed 15 atom percent.

8. The method according to claim 7 wherein the percentage of gallium does not exceed 12 atom percent.

9. The method according to claim 5 wherein said predetermined temperature is a maximum of 750° C.

10. The method according to claim 1 wherein said superconductive intermetallic compound is $Nb_3Sn$.

11. The method according to claim 10 wherein said ductile, first element consists of niobium and said carrier metal consists of one of the group consisting of copper, silver and ductile alloys of copper and silver and tin in a percentage up to 8.5 atom percent.

12. The method according to claim 11 wherein the percentage of tin is a maximum of 4 atom percent.

13. The method according to claim 10 wherein said predetermined temperature is a maximum of 850° C.

14. The method according to claim 13 wherein said predetermined temperature is a maximum of 800° C.

15. The method according to claim 1 wherein said chamber is evacuated to a maximum gas pressure of $10^{-5}$ torr.

16. The method according to claim 1 wherein said chamber is charged with helium and said predetermined time of heating is a minimum of 100 hours.

17. The method according to claim 1 wherein said chamber is charged with argon at a maximum pressure of 100 torr and said predetermined time of heating is a minimum of 100 hours.

18. The method according to claim 2 and further including the step of forming said wires of said first element in the form of cylindrical members and inserting in each of said cylindrical members a core of electrically and thermally highly conductive metal selected from the group consisting of copper and silver which is normally conducting at the operating temperature of the superconductor prior to insertion of said wires into said matrix of carrier metal.

* * * * *

UNITED STATES PATENT AND TRADEMARK OFFICE
CERTIFICATE OF CORRECTION

PATENT NO. : 4 037 313
DATED : July 26, 1977
INVENTOR(S) : Manfred Wilhelm

It is certified that error appears in the above-identified patent and that said Letters Patent are hereby corrected as shown below:

Col. 2, line 16, delete "galium" and insert --gallium--

Col. 3, line 9, delete "if" and insert --is--;

Col. 4, line 31, delete "To" and insert --to--;

Col. 5, line 29, delete "AB" and insert --$A_3B$--;

Col. 5, line 43, delete "ot" and insert --to--;

Col. 5, line 53, delte "th" and insert --the--;

Col. 10, line 22, delete "jacekt" and insert --jacket--

Col. 12, line 57 (claim 4), delete "of the group of claim 1" and insert --of the group of claim 3--.

Signed and Sealed this

Twenty-ninth Day of November 1977

[SEAL]

Attest:

RUTH C. MASON
Attesting Officer

LUTRELLE F. PARKER
Acting Commissioner of Patents and Trademarks